(12) United States Patent
Blankenship et al.

(10) Patent No.: US 12,212,340 B2
(45) Date of Patent: *Jan. 28, 2025

(54) CONCATENATED POLAR CODE WITH ADAPTIVE ERROR DETECTION

(71) Applicant: Telefonaktiebolaget LM Ericsson (PUBL), Stockholm (SE)

(72) Inventors: Yufei Blankenship, Kildeer, IL (US); Dennis Hui, Sunnyvale, CA (US)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/485,381

(22) Filed: Oct. 12, 2023

(65) Prior Publication Data
US 2024/0039560 A1 Feb. 1, 2024

Related U.S. Application Data

(63) Continuation of application No. 17/488,531, filed on Sep. 29, 2021, now Pat. No. 11,824,561, which is a
(Continued)

(51) Int. Cl.
*H03M 13/35* (2006.01)
*H03M 13/09* (2006.01)
(Continued)

(52) U.S. Cl.
CPC ....... *H03M 13/353* (2013.01); *H03M 13/096* (2013.01); *H03M 13/1148* (2013.01); *H03M 13/2792* (2013.01); *H03M 13/2906* (2013.01)

(58) Field of Classification Search
CPC ............ H03M 13/09; H03M 13/1148; H03M 13/096; H03M 13/13; H03M 13/353;
(Continued)

(56) References Cited

U.S. PATENT DOCUMENTS 11,165,445 B2 * 11/2021 Blankenship ....... H03M 13/098
11,824,561 B2 * 11/2023 Blankenship ......... H03M 13/13
(Continued)

FOREIGN PATENT DOCUMENTS

CN        101076176 A     11/2007
CN        101247543 A      8/2008
(Continued)

OTHER PUBLICATIONS

Huawei et al., "Performance evaluation of channel coding schemes for control", 3GPP TSG RAN WG1 Meeting #87, Reno, USA, Nov. 14-18, 2016, pp. 1-11, R1-1611257, 3GPP.
(Continued)

*Primary Examiner* — Guy J Lamarre

(57) ABSTRACT

According to certain embodiments, a method by a transmitter is provided for adaptively generating precoder bits for a Polar code. The method includes acquiring at least one configuration parameter upon which a total number of precoder bits depends. The at least one configuration parameter comprising at least one of an information block length K, a code block length N, and/or a code rate R=K/N. The total number of precoder bits is determined, and the precoder bits for a code block are generated according to the determined total number of precoder bits. The precoder bits are placed within the code block.

24 Claims, 15 Drawing Sheets

Related U.S. Application Data continuation of application No. 16/483,188, filed as application No. PCT/IB2018/050734 on Feb. 6, 2018, now Pat. No. 11,165,445.

(60) Provisional application No. 62/455,128, filed on Feb. 6, 2017.

(51) Int. Cl.
  *H03M 13/11* (2006.01)
  *H03M 13/27* (2006.01)
  *H03M 13/29* (2006.01)

(58) Field of Classification Search
  CPC ......... H03M 13/2792; H03M 13/2906; H03M 13/098; H04L 1/0072; H04L 1/0071; H04L 1/0061; H04L 1/0064; H04L 1/0057
  See application file for complete search history.

(56) References Cited

U.S. PATENT DOCUMENTS

| | | | |
|---|---|---|---|
| 2010/0005375 | A1 | 1/2010 | Dell et al. |
| 2010/0251082 | A1 | 9/2010 | Cheng et al. |
| 2014/0173376 | A1 | 6/2014 | Jeong et al. |
| 2016/0056842 | A1 | 2/2016 | Linstadt et al. |
| 2016/0079999 | A1 | 3/2016 | Shen et al. |
| 2016/0269050 | A1 | 9/2016 | Shen et al. |
| 2018/0198894 | A1 | 7/2018 | Nammi et al. |
| 2018/0205498 | A1 | 7/2018 | Kudekar et al. |
| 2019/0068225 | A1 | 2/2019 | Yu |
| 2019/0190655 | A1 | 6/2019 | Pan et al. |
| 2019/0229860 | A1 | 7/2019 | Yoshimura et al. |
| 2019/0393987 | A1 | 12/2019 | Hong et al. |
| 2019/0394673 | A1 | 12/2019 | Hwang et al. |
| 2020/0187166 | A1 | 6/2020 | Xu et al. |

FOREIGN PATENT DOCUMENTS

| | | |
|---|---|---|
| CN | 101262635 | 9/2008 |
| CN | 101296028 A | 10/2008 |
| CN | 101536406 A | 9/2009 |
| RU | 2014 110 139 | 3/2014 |

OTHER PUBLICATIONS

Intel Corporation, "Discussion on Control channel coding for NR", 3GPP TSG RAN WG1 Meeting #87, Reno, Nevada, Nov. 14-18, 2016, pp. 1-4, R1-1612587, 3GPP.

Intel Corporation, "Polar code constructions for evaluations", 3GPP TSG RAN WG1 Meeting #85, Nanjing, China, May 23-27, 2016, R1-164185, pp. 1-2, 3GPP.

Intel Corporation, "Polar code design for NR", 3GPP TSG RAN WG1 Meeting #85, Nanjing, China, May 23-27, 2016, R1-164184, pp. 1-4, 3GPP.

Hybrid Parity-Check and CRC Aided SCL Decoding for Polar Codes by Qingping Yu et al.; IEEE International Conference on Internet of Things an IEEE Green Computing and Communications and IEEE Cyber, Physical and Social Computing and IEEE Smart Data—2016.

Notice of Reasons for Rejection issued for Patent Application No. 2019-542449—Dec. 22, 2020.

Channel Polarization: a Method for Constructing Capacity-Achieving Codes for Symmetric Binary-Input Memoryless Channels by Erdal Arikan; IEEE Transactions on Information Theory, vol. 55, No. 7—Jul. 2009.

PCT Notification of Transmittal of the International Preliminary Report on Patentability or International application No. PCT/IB2018/050734—Apr. 23, 2019.

List Decoding of Polar Codes by Ido Tal and Alexander Vardy; 2011 IEEE International Symposium on Information Theory Proceedings—2011.

3GPP TSG RAN WG1 Meeting #86; Goteborg, Sweden; Source: Intel Corporation; Title: Channel Coding scheme for URLLC, MMTC, and control channels (R1-167703)—Aug. 2016.

3GPP TSG RAN WG1 Ad-Hoc Meeting; Spokane, USA; Source: Huawei, HiSilicon; Title: Summary of polar codes design for control channels (R1-1700088)—Jan. 16-20, 2017.

3GPP TSG RAN WG1 Ad hoc; Spokane, USA; Source: Intel; Title: Considerations in Polar code design (R1-1700385)—Jan. 16-20, 2017.

3GPP TSG RAN WG1 Ad hoc; Spokane, USA; Source: Intel Corporation; Title: Polar code design (R1-1700386)—Jan. 16-20, 2017.

3GPP TSG-RAN WG1 NR AdHoc; Spokane, USA; Source: Qualcomm Incorporated; Title: Design of Polar codes for control channel (R1-1700832)—Jan. 16-20, 2017.

PCT International Search Report issued for International application No. PCT/IB2018/050734—Jun. 7, 2018.

PCT Written Opinion of the International Searching Authority for International application No. PCT/IB2018/050734—Jun. 7, 2018.

Communication Pursuant to Article 94(3 ) EPC issued for Application No. 18 708 205.2-1220—Mar. 27, 2020.

Communication Pursuant to Article 94(3) EPC issued by the EPO for Application No. 18 708 205.2-1220—Nov. 14, 2019.

3GPP TSG-RAN WG1 #87; Reno, U.S.A.; Source: Nokia, Alcatel-Lucent Shanghai Bell; Title: Polar codes for control channels (R1-1612284)—Nov. 14-18, 2016.

Japanese Notice of Reasons for Rejection issued for Patent Application No. 2019-542449—Aug. 26, 2021.

* cited by examiner

CONCATENATED POLAR CODE WITH ADAPTIVE ERROR DETECTION

PRIORITY

This application is a continuation, under 35 U.S.C. § 120, of U.S. patent application Ser. No. 17/488,531 filed on Sep. 29, 2021 which is a continuation, under 35 U.S.C. § 120, of U.S. patent application Ser. No. 16/483,188 filed on Aug. 2, 2019 which is a U.S. National Stage Filing under 35 U.S.C. 371 of International Patent Application Serial No. PCT/IB2018/050734 filed Feb. 6, 2018 and entitled "Concatenated Polar Code with Adaptive Error Detection" which claims priority to U.S. Provisional Patent Application No. 62/455,128 filed Feb. 6, 2017 each of which are hereby incorporated by reference in their entirety.

TECHNICAL FIELD

Embodiments of the invention relate to the field of wireless communication; and more specifically, to methods, apparatus and systems for implementing concatenated Polar code with adoptive error detection.

BACKGROUND

Polar codes, proposed by E. Arikan in "Channel Polarization: A Method for Constructing Capacity-Achieving Codes for Symmetric Binary-Input Memoryless Channels," IEEE Transactions on Information Theory, vol. 55, pp. 3051-3073, July 2009, are the first class of constructive coding schemes that are provable to achieve the symmetric capacity of the binary-input discrete memoryless channels under a low-complexity successive cancellation (SC) decoder. However, the finite-length performance of Polar codes under SC is not competitive compared to other modern channel coding schemes such as low-density parity-check (LDPC) codes and Turbo codes. Later, an SC list (SCL) decoder was proposed by I. Tal and A. Vardy in "List Decoding of Polar codes," in Proceedings of IEEE Symp. Inf. Theory, pp. 1-5, 2011, which can approach the performance of an optimal maximum-likelihood (ML) decoder. By concatenating a simple Cyclic Redundancy Check (CRC) coding, it was shown that the performance of concatenated Polar code is competitive with that of well-optimized LDPC and Turbo codes. As a result, Polar codes have been adopted as a channel coding technique for downlink control information (DCI) and uplink control information (UCI) of 3GPP New Radio (NR), where NR is a 5G wireless communication system.

The main idea of Polar coding is to transform a pair of identical binary-input channels into two distinct channels of different qualities, one better and one worse than the original binary-input channel. By repeating such a pair-wise Polarizing operation on a set of $2^M$ independent uses of a binary-input channel, a set of $2^M$ "bit-channels" of varying qualities can be obtained. Some of these bit channels are nearly perfect (i.e. error free) while the rest of them are nearly useless (i.e. totally noisy). The point is to use the nearly perfect channel to transmit data to the receiver while setting the input to the useless channels to have fixed or frozen values (e.g. 0) known to the receiver. For this reason, those input bits to the nearly useless and the nearly perfect channel are commonly referred to as frozen bits and non-frozen (or information) bits, respectively. Only the non-frozen bits are used to carry data in a Polar code. An illustration of the structure of a length-8 Polar code is illustrated in FIG. 1.

Although the original Polar code, as proposed by Arikan, was proven to be capacity achieving with a low-complexity successive cancellation (SC) decoder, the finite-length performance of Polar codes under SC is not competitive compared to other modern channel coding schemes such LDPC and Turbo codes. A more complex decoder, namely the SC list (SCL) decoder, is proposed by I. Tal and A. Vardy, where a list of more than one surviving decision paths is maintained in the decoding process, but the resulting performance is still unsatisfactory. I. Tal and A. Vardy further proposed that by concatenating a linear outer code, namely a CRC code, with the original Polar code as inner code, the outer code can be used to check if any of the candidate paths in the list is correctly decoded. Such a two-step decoding process significantly improves the performance and makes Polar codes competitive with that of well-optimized LDPC and Turbo codes.

When designing concatenated Polar codes for error correction control of downlink control information (DCI) and uplink control information (UCI) of NR, one type is CRC-assisted Polar coding (CA-Polar), where the CRC bits are attached as a precoder of Polar codes for two purposes: error detection and error correction. According to previous approaches, the number of CRC bits used for error detection and error correction, respectively, are fixed. However, fixed number of CRC bits imply fixed error detection and error correction capabilities. This does not fit the needs of the various traffic types in NR. For example, DCI associated with Ultra-Reliable and Low Latency Communications (URLLC) data is expected to require higher reliability than the DCI associated with the eMBB data. Hence there is a need to explore methods where adaptive error detection and error correction capability can be supported in NR.

Another type of concatenated Polar codes is PC-Polar, where a sequence of parity checksum (PC) bits are generated before Polar encoding. Similar to CA-Polar, the sequence of PC bits are fixed for a given (K, M), and all the PC bits are used for error correction. Here K is the number of information bits, and M the number of coded bits to send over the air. For PC-Polar, it is also desirable to have adaptive error detection and error correction capability.

SUMMARY

To address the foregoing problems with existing solutions, disclosed is systems and methods for adaptively selecting a total number of CRC or PC bits and/or allocating a different amount of the available CRC bits between error detection and error correction for Polar codes.

According to certain embodiments, a method by a transmitter is provided for adaptively generating precoder bits for a Polar code. The method includes acquiring at least one configuration parameter upon which a total number of precoder bits depends. The at least one configuration parameter comprising at least one of an information block length K, a code block length N, and/or a code rate R=K/N. The total number of precoder bits is determined, and the precoder bits for a code block are generated according to the determined total number of precoder bits. The precoder bits are placed within the code block.

According to certain embodiments, a method by a transmitter is provided for adaptively generating precoder bits for a Polar code. The method includes allocating a different amount of available precoder bits between error detection and error correction for the Polar code. The precoder bits are generated for a code block according to the allocation and a total number of CRC bits. The precoder bits are placed within the code block.

According to certain embodiments, a method by a receiver is provided for adaptively using precoder bits to assist decoding of a Polar code. The method includes allocating a different amount of available precoder bits between error detection and error correction for Polar codes. The precoder bits allocated for error correction are used to assist decoding of a code block. After decoding the code block, the precoder bits allocated for error detection are used to perform error detection on the decoded bits.

According to certain embodiments, a transmitter is provided for adaptively generating precoder bits for a Polar code. The transmitter includes at least one processor configured to acquire at least one configuration parameter upon which a total number of precoder bits depends. The at least one configuration parameter comprising at least one of an information block length K, a code block length N, and/or a code rate R=K/N. The total number of precoder bits is determined, and the precoder bits for a code block are generated according to the determined total number of precoder bits. The precoder bits are placed within the code block.

According to certain embodiments, a transmitter is provided for adaptively generating precoder bits for a Polar code. The transmitter includes at least one processor configured to allocate a different amount of available precoder bits between error detection and error correction for the Polar code. The precoder bits are generated for a code block according to the allocation and a total number of CRC bits. The precoder bits are placed within the code block.

According to certain embodiments, a receiver is provided for adaptively using precoder bits to assist decoding of a Polar code. The receiver includes at least one processor configured to allocate a different amount of available precoder bits between error detection and error correction for Polar codes. The precoder bits allocated for error correction are used to assist decoding of a code block. After decoding the code block, the precoder bits allocated for error detection are used to perform error detection on the decoded bits.

According to another embodiment, a method includes adaptively selecting the total number of CRC or PC bits, allocating a different amount of the available CRC bits between error detection and error correction for Polar codes, and placing the CRC bits within a code block.

According to certain particular embodiments, the precoder bits can be CRC bits.

According to an alternative particular embodiments, the precoder bits are parity-checksum (PC) bits.

Certain embodiments of the present disclosure may provide one or more technical advantages. For example, according to various embodiments, an advantage of features herein is to allow the concatenation of CRC code to be customized for different amounts of payloads, different coding parameters needed for the varying communication channel conditions, and different types of applications with different requirements in terms of, for example, latency and reliability. Since 5G wireless communications need to cover a wide range of circumstances and applications, embodiments of this disclosure allow the system to judiciously allocate radio resources based on cost-benefit tradeoffs.

Various other features and advantages will become obvious to one of ordinary skill in the art in light of the following detailed description and drawings. Certain embodiments may have none, some, or all of the recited advantages.

BRIEF DESCRIPTION OF THE DRAWINGS

The accompanying drawing figures incorporated in and forming a part of this specification illustrate several aspects of the disclosure, and together with the description serve to explain the principles of the disclosure.

DESCRIPTION OF EMBODIMENTS

Figure 1:
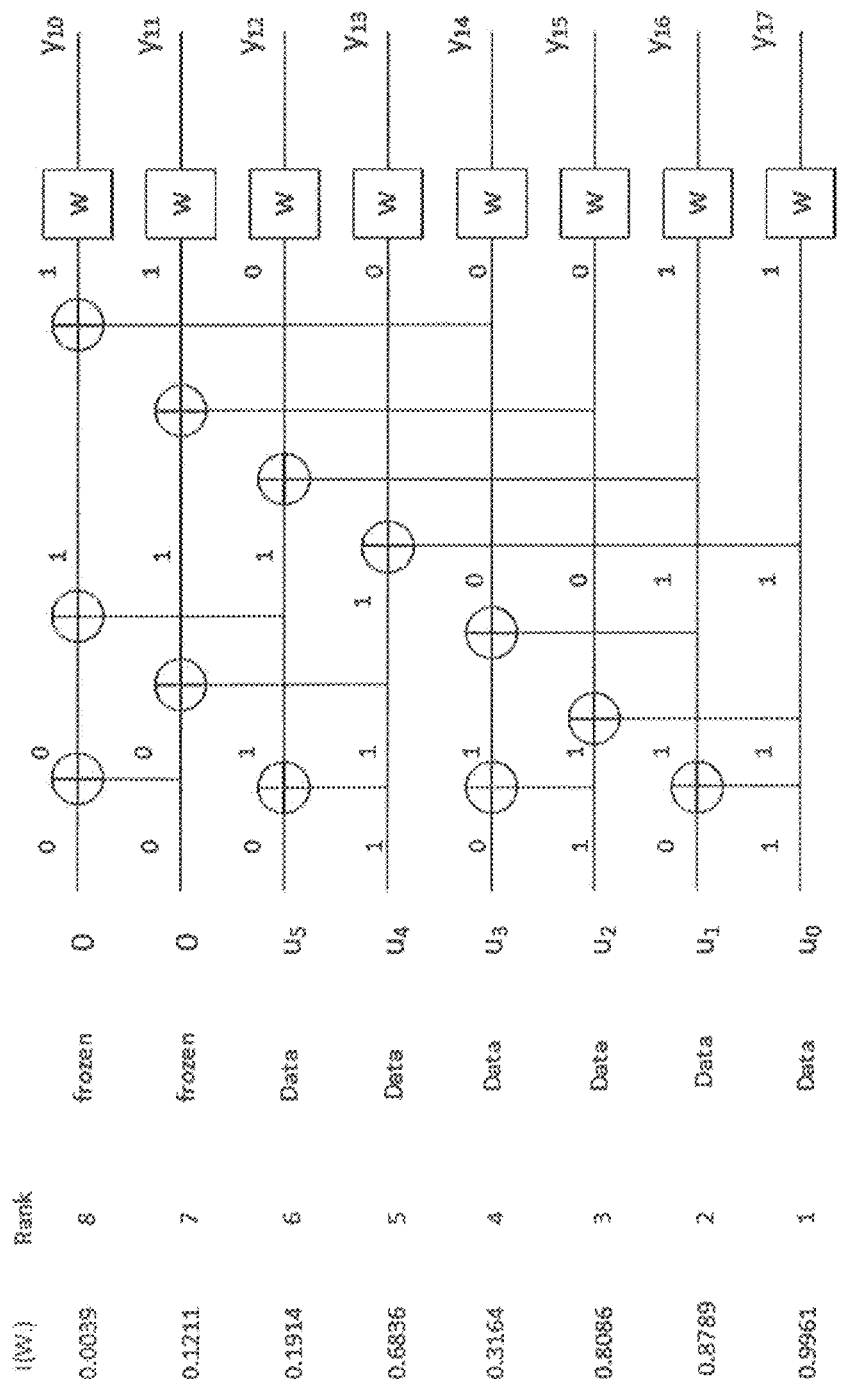
FIG. 1 illustrates an example of a Polar code structure with N=8.

In the following description, numerous specific details are set forth. However, it is understood that embodiments of the invention may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" is any node in a radio access network of a cellular communications network that operates to wirelessly transmit and/or receive signals. Some examples of a radio access node include, but are not limited to, a base station (e.g., an enhanced or evolved Node B (eNB) in a Third Generation Partnership Project (3GPP) Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network (PDN) Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP LTE terminology or terminology similar to 3GPP LTE terminology is oftentimes used. However, the concepts disclosed herein are not limited to LTE or a 3GPP system.

Figure 2:
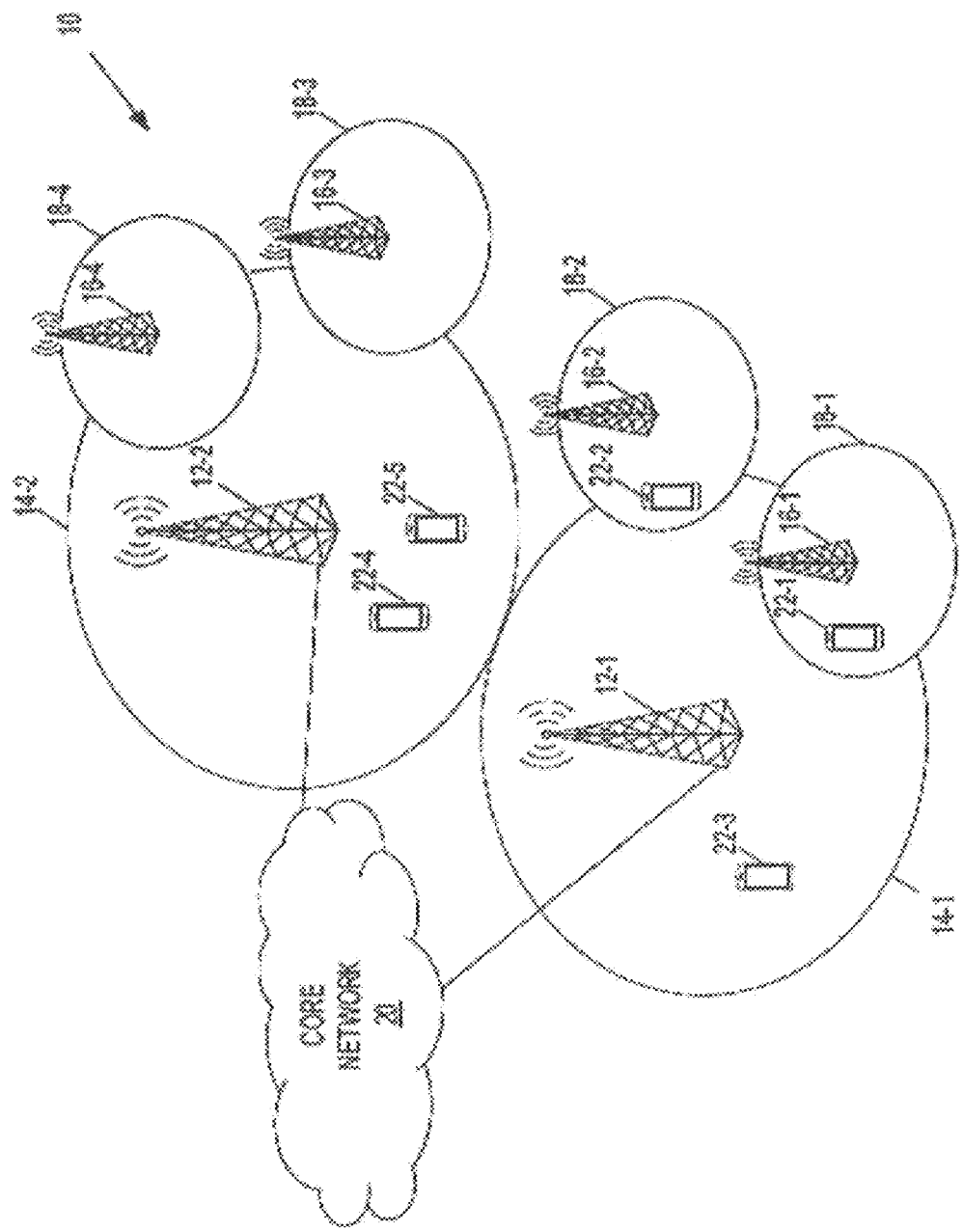
FIG. 2 illustrates an example cellular communications network, according to certain embodiments.

FIG. 2 illustrates one example of a cellular communications network 10 according to some embodiments of the present disclosure. In the embodiments described herein, the cellular communications network 10 is an LTE network in which some or all of the radio access nodes operate on a carrier(s) in an unlicensed spectrum. In a particular embodiment, for example, cellular communications network 10 may operate on the 5 gigahertz (GHz) spectrum. However, the present disclosure is not limited thereto. Accordingly, in another example, the cellular communications network 10 may implement LAA, LTE-U, MulteFire, or some other technology in which radio access nodes operate on an unlicensed carriers(s).

As depicted, the cellular communications network 10 includes base stations 12-1 and 12-2, which in LTE are referred to as eNBs, controlling corresponding macro cells 14-1 and 14-2. The base stations 12-1 and 12-2 are generally referred to herein collectively as base stations 12 and individually as base station 12. Likewise, the macro cells 14-1 and 14-2 are generally referred to herein collectively as macro cells 14 and individually as macro cell 14. The cellular communications network 10 also includes a number of low power nodes 16-1 through 16-4 controlling corresponding small cells 18-1 through 18-4. In LTE, the low power nodes 16-1 through 16-4 can be small base stations (such as pico or femto base stations) or Remote Radio Heads (RRHs), or the like. Notably, while not illustrated, one or more of the small cells 18-1 through 18-4 may alternatively be provided by the base stations 12. The low power nodes 16-1 through 16-4 are generally referred to herein collectively as low power nodes 16 and individually as low power node 16. Likewise, the small cells 18-1 through 18-4 are generally referred to herein collectively as small cells 18 and individually as small cell 18. The base stations 12 (and optionally the low power nodes 16) are connected to a core network 20.

The base stations 12 and the low power nodes 16 provide service to wireless devices 22-1 through 22-5 in the corresponding cells 14 and 18. The wireless devices 22-1 through 22-5 are generally referred to herein collectively as wireless devices 22 and individually as wireless device 22. In LTE, the wireless devices 22 are referred to as UEs.

According to certain embodiments, the macro cells 14 may be provided in a licensed frequency spectrum (i.e., in the frequency spectrum dedicated for the cellular communications network 10) such as, for example, for LAA operation. In other embodiments, the macro cells 14 may be provided in an unlicensed frequency spectrum such as, for example, for LAA in the unlicensed spectrum (LAA-U) or MulteFire operation. According to certain embodiments, one or more (and possibly all) of the small cells 18 may be provided in an unlicensed frequency spectrum such as, for example, the 5 GHz frequency spectrum.

In a particular embodiment, base stations 12, 14 that operate on a carrier(s) in an unlicensed spectrum may operate to perform LBT and transmit Multimedia. Broadcast Multicast. Services (MBMS) data according to any of the embodiments described herein.

Figure 3:
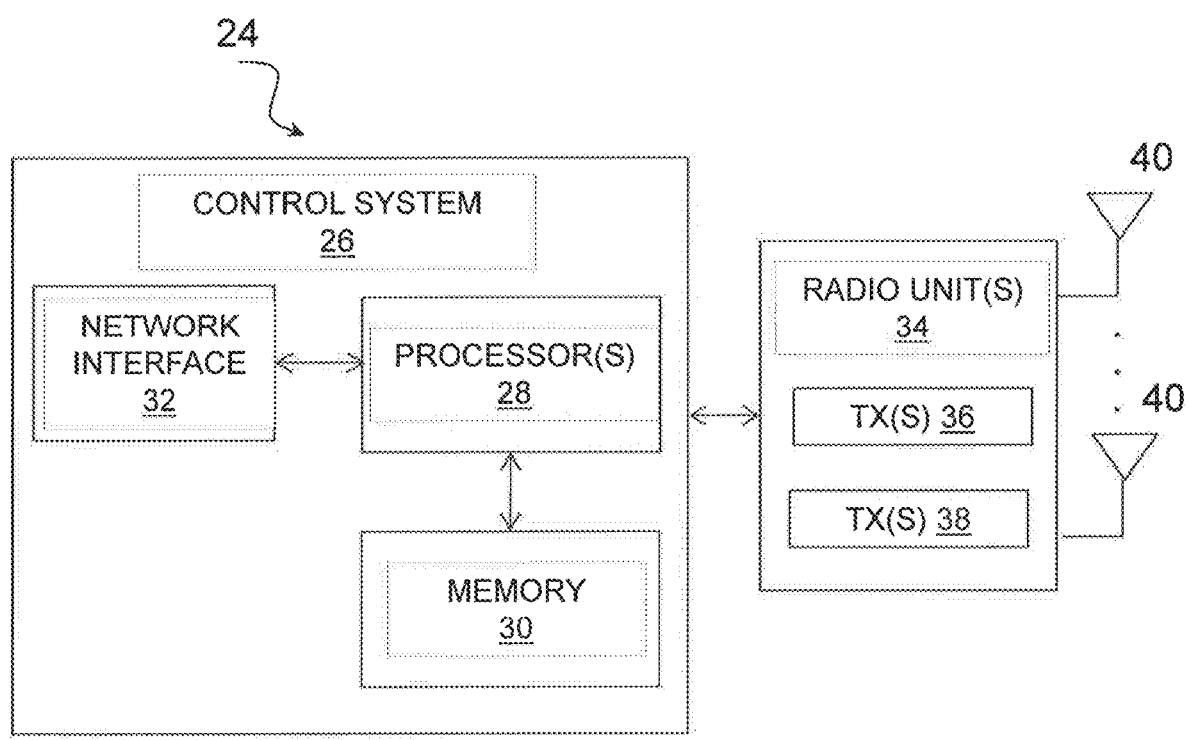
FIG. 3 illustrates an example radio access node, according to certain embodiments.

FIG. 3 is a schematic block diagram of radio access node 24, according to certain embodiments. The radio access node 24 may be, for example, a base station 12, 16. As illustrated, the radio access node 24 includes a control system 26 that includes one or more processors 28 (e.g., Central Processing Units (CPUs), Application Specific Integrated Circuits (ASICs), Field Programmable Gate Arrays (FPGAs), and/or the like), memory 30, and a network interface 32. In addition, the radio access node 24 includes one or more radio units 34 that each includes one or more transmitters 36 and one or more receivers 38 coupled to one or more antennas 40. In some embodiments, the radio unit(s) 34 is external to the control system 26 and connected to the control system 26 via, for example, a wired connection such as, for example, an optical cable. However, in some other embodiments, the radio unit(s) 34 and potentially the antenna(s) 40 may be integrated together with the control system 26. The one or more processors 28 may operate to provide one or more functions of a radio access node 24 as described herein. In some embodiments, the function(s) may be implemented in software that is stored such as, for example, in the memory 30 and executed by the one or more processors 28.

Figure 4:
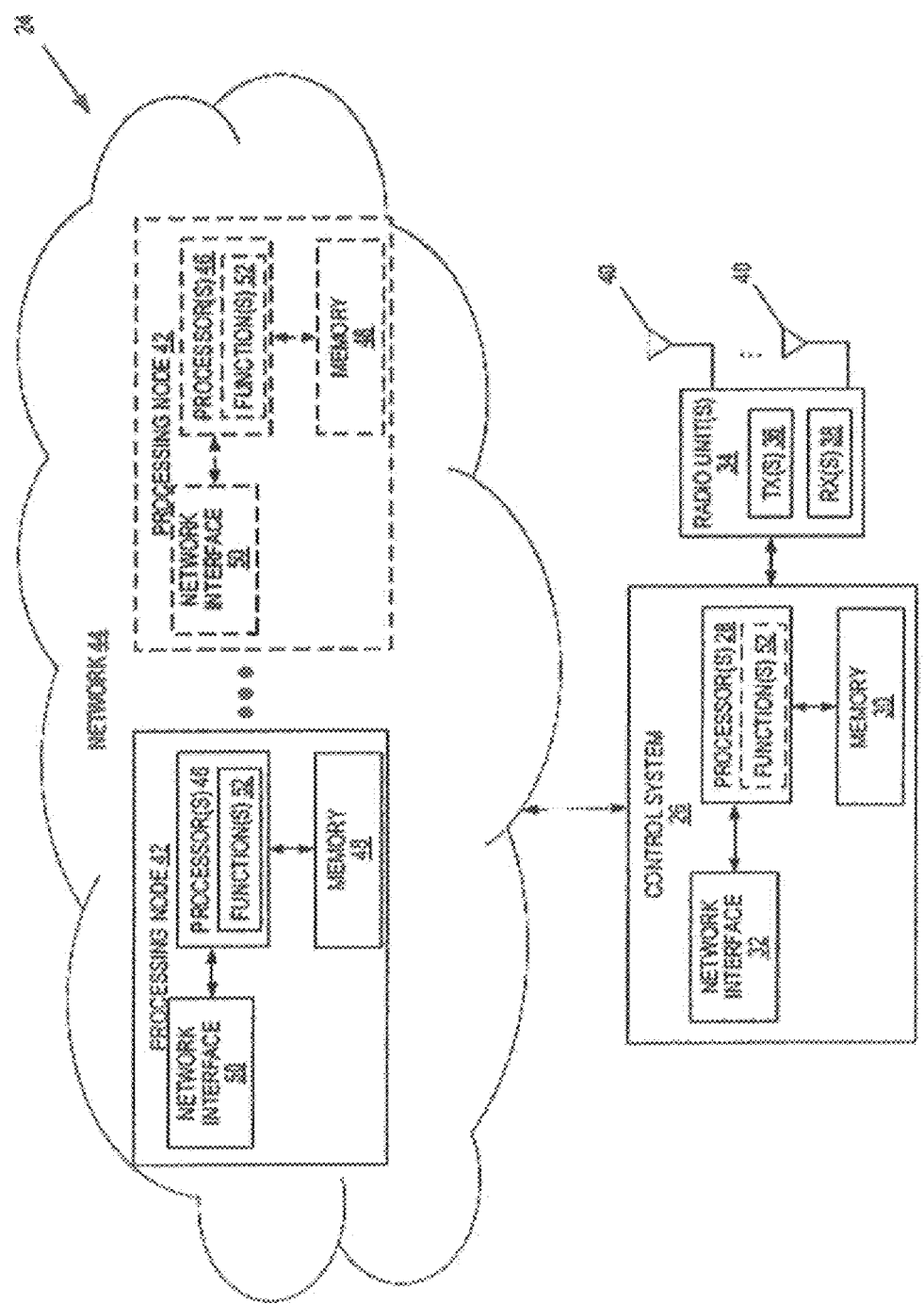
FIG. 4 illustrates an example virtualized radio access node, according to certain embodiments.

FIG. 4 is a schematic block diagram that illustrates a virtualized embodiment of the radio access node 24, according to certain embodiments. However, the description thereof may be equally applicable to other types of network nodes. Further, any of the types of network nodes may have similar virtualized architectures.

As used herein, a "virtualized" radio access node is an implementation of the radio access node 24 in which at least a portion of the functionality of the radio access node 24 is implemented as a virtual component(s). For example, the functionality of the radio access node may be implemented via a virtual machine(s) executing on a physical processing node(s) in a network(s), in a particular embodiment. In the illustrated example embodiment, the radio access node 24 includes the control system 26 that includes the one or more processors 28 (e.g., CPUs, ASICs, FPGAs, and/or the like), the memory 30, and the network interface 32 and the one or more radio units 34 that each includes the one or more transmitters 36 and the one or more receivers 38 coupled to the one or more antennas 40, as described above. The control system 26 is connected to the radio unit(s) 34 via, for example, an optical cable or the like. The control system 26 is connected to one or more processing nodes 42 coupled to or included as part of a network(s) 44 via the network interface 32. Each processing node 42 includes one or more processors 46 (e.g., CPUs, ASICs, FPGAs, and/or the like), memory 48, and a network interface 50.

According to certain embodiments, functions 52 of the radio access node 24 described herein may be implemented at the one or more processing nodes 42 or distributed across the control system 26 and the one or more processing nodes 42 in any desired manner. In some particular embodiments, some or all of the functions 52 of the radio access node 24 described herein are implemented as virtual components executed by one or more virtual machines implemented in a virtual environment(s) hosted by the processing node(s) 42. As may be appreciated by one of ordinary skill in the art, additional signaling or communication between the processing node(s) 42 and the control system 26 may be used in order to carry out at least some of the desired functions 52. Notably, in some embodiments, the control system 26 may not be included, in which case the radio unit(s) 34 communicate directly with the processing node(s) 42 via an appropriate network interface(s).

According to certain embodiments, a computer program including instructions which, when executed by at least one processor, causes the at least one processor to carry out the functionality of radio access node 24 or a node (e.g., a processing node 42) implementing one or more of the functions 52 of the radio access node 24 in a virtual environment according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 5:
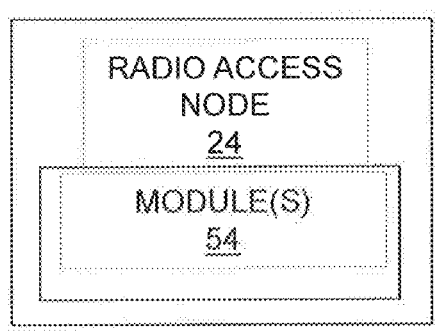
FIG. 5 illustrates another example radio access node, according to certain embodiments.

FIG. 5 is a schematic block diagram illustrating another example radio access node 24, according to certain other embodiments. The radio access node 24 includes one or more modules 54, each of which is implemented in software. The module(s) 54 provide the functionality of the radio access node 24 described herein. This discussion is equally applicable to the processing node 42 of FIG. 7 (described below) where the modules 54 may be implemented at one of the processing nodes 42 or distributed across multiple processing nodes 42 and/or distributed across the processing node(s) 42 and the control system 26.

Figure 6:
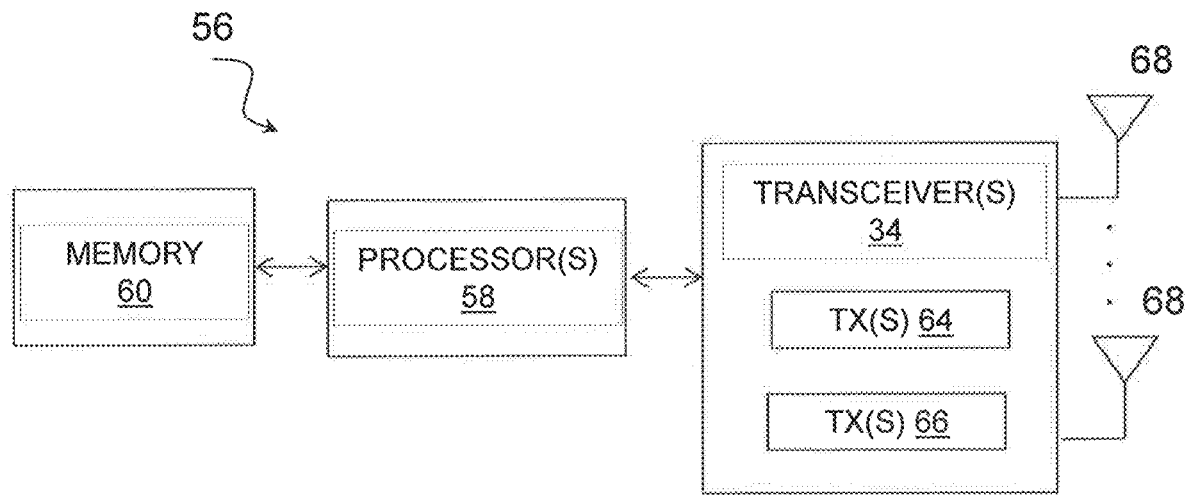
FIG. 6 illustrates an example user equipment, according to certain embodiments.

FIG. 6 is a schematic block diagram of a UE 56, according to certain embodiments. As illustrated, the UE 56 includes one or more processors 58 (e.g., CPUs, ASICs, FPGAs, and/or the like), memory 60, and one or more transceivers 62 each including one or more transmitters 64 and one or more receivers 66 coupled to one or more antennas 68. In some embodiments, the functionality of the UE 56 described above may be fully or partially implemented in software that is, e.g., stored in the memory 60 and executed by the processor(s) 58.

In some embodiments, a computer program including instructions which, when executed by at least one processor, causes the at least one processor to carry out the functionality of the UE 56 according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 7:
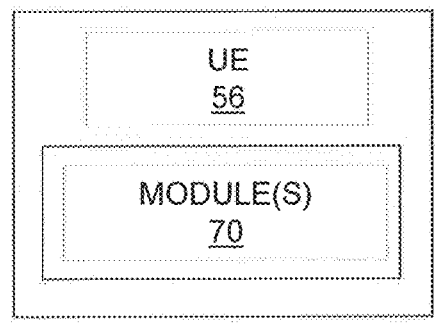
FIG. 7 illustrates an example virtualized user equipment, according to certain embodiments.

FIG. 7 is a schematic block diagram of the UE 56 according to some other embodiments of the present disclosure. The UE 56 includes one or more modules 70, each of which is implemented in software. The module(s) 70 provide the functionality of the UE 56 described herein.

Various network nodes can perform the functionality described below. For example, an access node (e.g., an eNB) could perform the various interleaving steps provided herein. One of ordinary skill in the art would realize that a receiver (e.g., a UE) would be able to perform the corresponding decoding, according to one example. Of course, it would be readily understood by one of ordinary skill in the art that various combinations of radio nodes could be implemented to perform the functionality described herein.

It should be noted that while the discussion herein uses the downlink control information (DCI) and uplink control information (UCI) as an example, the methods disclosed below can be used for any type of information packet transmission that require both the function of error detection and the function of error correction. Hence, for example, the same methods can be applied to physical uplink channel data packets, physical downlink data channel packets, higher layer control packets, etc.

Note that while two types of precoders, CRC and PC, are used as example in discussion below, the same principle can be applied to other types of precoders, e.g., other types of linear block codes.

According to certain embodiments, when designing concatenated Polar codes for error correction control of DCI and UCI of NR, CRC bits are attached as a precoder of Polar codes for two purposes:

A sequence of $L_{d,0}$ CRC bits, where $L_{d,0}$ is the minimum number of CRC bits necessary to ensure minimum level of error detection capability. Using 3GPP LTE as a reference, $L_{d,0}=16$ for DCI, $L_{d,0}=8$ for UCI of larger information block size K.

An additional $L_{c,0}$ CRC bits attached. The additional $L_{c,0}$ CRC bits can be used for error detection and/or error correction purposes.

Hence a total of $L_{total}=+L_{c,0}$) CRC bits are attached in the precoder of Polar codes. In a particular embodiment, the $L_{total}$ CRC bits are generated using one CRC generator polynomial of length $L_{total}$. In another embodiment, the $L_{d,0}$ CRC bits are generated using a first CRC generator polynomial of length $L_{d,0}$, while the $L_{c,0}$ CRC bits are generated using a second CRC generator polynomial of length $L_{c,0}$.

According to certain embodiments, adaptive allocation of CRC bits between error correction and error detection is provided. The set of $L_{total}$ CRC bits may be used in an adaptive manner to achieve the best combination of error detection performance and error correction performance. The adaptation may be performed such that at least two of the following three options of allocating the CRC bits for different purposes are supported, according to a particular embodiment:

OPTION A: Lower error detection capability, higher error correction capability. In this option, $L_{d,1}$ CRC bits are used for error detection, $L_{c,1}$ CRC bits are used to assist with SCL decoding (i.e., error correction).

OPTION B: Medium error detection capability, medium error correction capability. In this option, $L_{d,2}$ CRC bits are used for error detection, $L_{c,2}$ CRC bits are used to assist with SCL decoding (i.e., error correction).

OPTION C: Higher error detection capability, lower error correction capability. In this option, $L_{d,3}$ CRC bits are used for error detection, $L_{c,3}$ CRC bits are used to assist with SCL decoding (i.e., error correction).

In the above scenarios, $L_{total}=(L_{d,1}+L_{c,1})=(L_{d,2}+L_{c,2})=(L_{d,3}+L_{c,3})$, with: $L_{d,0}<=L_{d,1}<L_{d,2}<L_{d,3}$, $L_{c,0}>=L_{c,1}>L_{c,2}>L_{c,3}$. It may be taken into account that larger number of CRC bits used for SCL decoding generally requires a more complex decoder implementation, which is then able to achieve better BLER performance of the same information block size K and codeword size M. Note that in each of the scenarios mentioned above, a predetermined subset of $L_{c,i}$ CRC bits is used for error correction, for any i=1,2,3, but the bits chosen for error correction need not be consecutive or contiguous and can be, for example, spaced evenly across the available CRC bits, in a particular embodiment. While three different ways to balance the error detection and error correction capabilities are described in Options A-C, it may be understood that more ways to balance are possible using the same or similar principles.

According to certain particular embodiments, the adaption can be performed as a function of various configuration parameters, including:

According to various particular embodiments, the adaptation may be performed according to different target levels of reliability of the service. For example, for high reliability applications (e.g. URLLC), Option A may be used, in a particular embodiment. On the other hand, for low reliability applications (e.g., mMTC), Option C may be used, in a particular embodiment.

According to various particular embodiments, the adaptation may be performed according to the latency target of the associated data packet. The target latency can also be reflected by the maximum number retransmissions possible for the associated data packet. For example, for data packets with a low-latency requirement, Option A may be used, in a particular embodiment. Examples of low-latency scenarios include: video packet, voice packet, and instantaneous channel feedback. More CRC bits are used for error correction, since detecting an error may not help the applications as retransmission is not worth the delay. On the other hand, for data packets that can tolerate high latency, Option C may be used, in a particular embodiment.

According to various particular embodiments, the adaptation may be performed according to different receiver categories (or receiver types). Typically, the receiver is the UE on the downlink. For example, for lower-cost UEs, lower-complexity SCL decoder implementation is desired, hence Option C may be used, in a particular embodiment. For higher-cost UEs, higher-complexity SCL decoder implementation can be afforded, hence Option A may be used in a particular embodiment. For a medium-cost UE, Option B may be used in an exemplary compromise.

According to certain embodiments, the total number of CRC bits ($L_{total}$) may be adaptively chosen according to different configuration parameters. Examples include:

According to various particular embodiments, the choice of the total number of CRC bits may be selected according to different target levels of reliability of the service. For example, for high reliability applications (e.g. URLLC), a larger total number of CRC bits may be used. On the other hand, for low reliability applications (e.g., mMTC), a smaller number of total CRC bits is used.

According to various particular embodiments, the choice of the total number of CRC bits is chosen according to the information block length K, the code block length N, and/or the code rate R=K/N. For a fixed code length N more CRC bits may be used for small number of information bits K, or equivalently, for lower rate R, and vice versa.

Note that the adaptation of total number of CRC bits $L_{total}$ can be done along with its corresponding allocation between error correction purpose ($L_{c,i}$ bits) and error detection purpose ($L_{d,i}$ bits) as described above.

Figure 8:
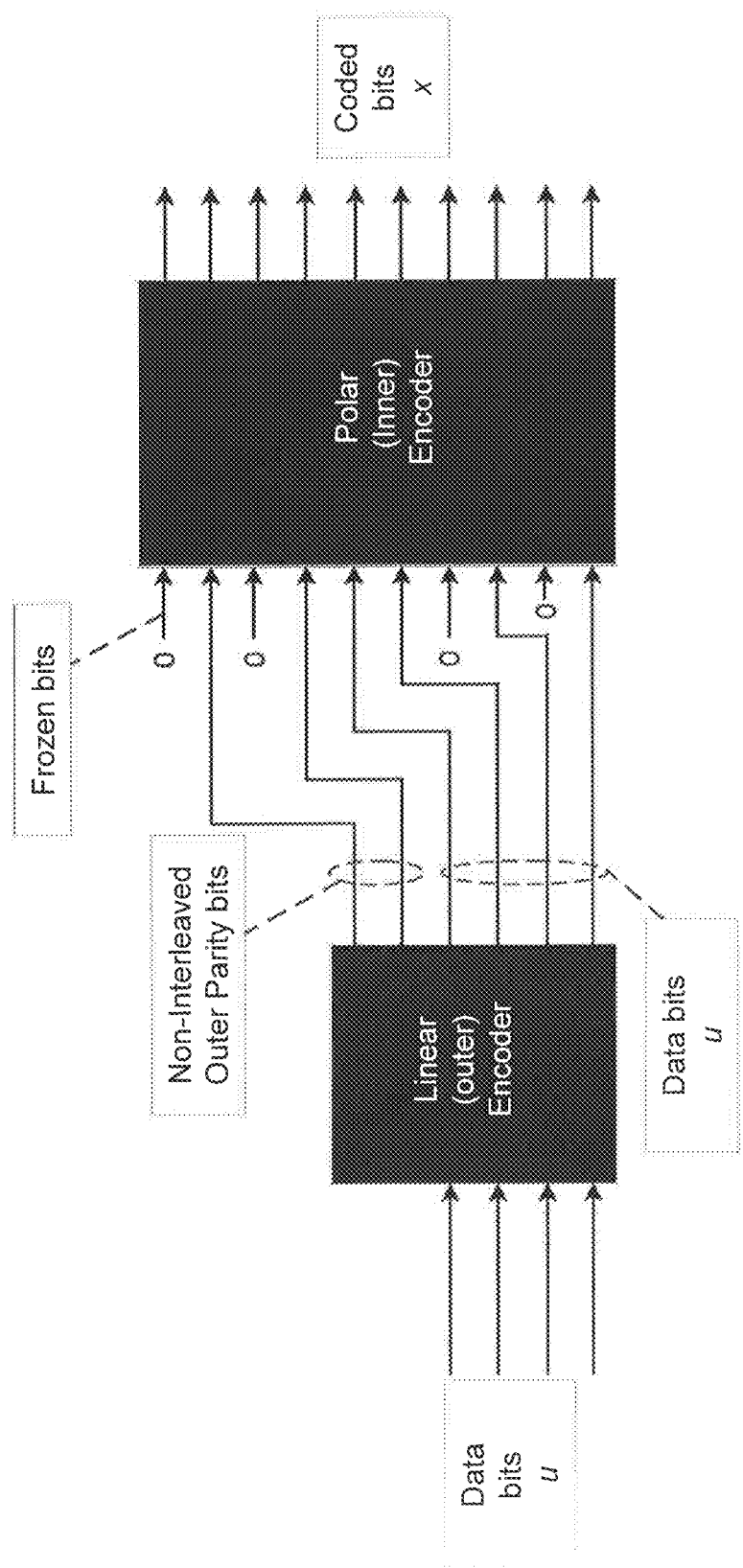
FIG. 8 illustrates an example encoder structure of concatenated Polar code without interleaving, according to certain embodiments.

According to certain embodiments, the placement of CRC bits may be adaptively chosen. FIG. 8 illustrates an encoder structure of concatenated Polar code without interleaving, according to certain embodiments. As shown, the CRC bits are attached as a contiguous block and not interleaved with the information bits. Typically, the sequence of CRC bits are attached to the end of information bit sequence, as shown in FIG. 8.

When the sequence of $L_{total}$ CRC bits are attached as a contiguous block to the end of info bit sequence, the CRC bits must be used as a block to perform CRC check. The CRC bits cannot be used individually to perform CRC check. Thus, the CRC bits are treated the same as the information bits in the SCL decoding process until the very end of the trellis. At the end of the trellis, the CRC bits are used to perform CRC check and select the best codeword candidate as decoder output.

Even though the CRC bits are attached at the end of the block, some of the CRC bits may still be integrated into a list decoder for the Polar inner code to limit the decoding to within a subspace that is consistent with those CRC bits integrated into the list decoding process. This would improve the error correction capability of the resulting integrated list decoding process. However, since the CRC bits are clustered together in the end, the performance benefit is limited. If further performance benefit is desired, one may consider using an "Interleaved CRC bits" construction as described below.

Figure 9:
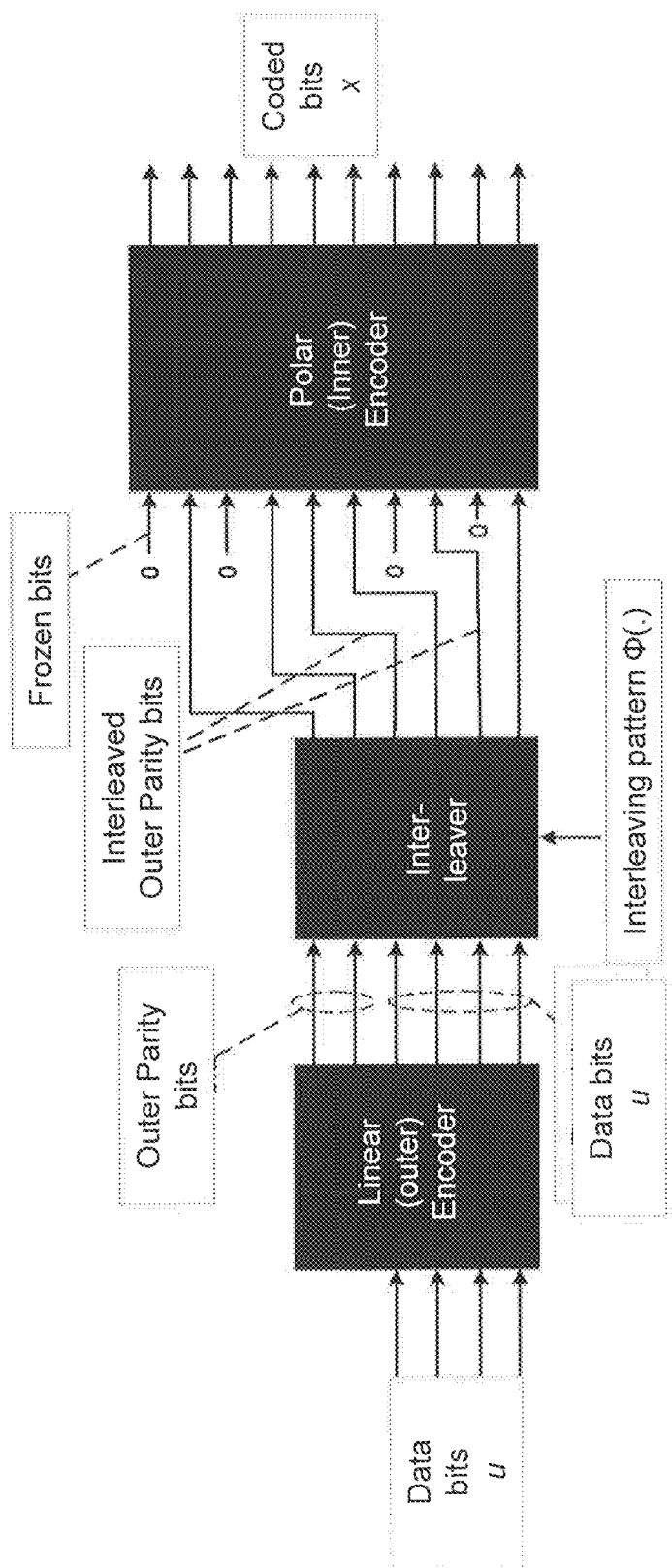
FIG. 9 illustrates an example encoder structure with interleaved CRC bits, according to certain embodiments.

FIG. 9 illustrates an encoder structure using interleaved CRC bits, according to certain embodiments. Specifically, the sequence of $L_{total}$ CRC bits may be interleaved with information bits before Polar encoding. In a particular embodiment, the CRC bits may be coupled with such an interleaver that the CRC bits can be used individually to perform a CRC check. One example of the encoder structure using interleaved CRC bits is illustrated in FIG. 9.

According to certain embodiments, and as depicted, an interleaver may be added between the CRC outer code and the Polar inner code. Thus, the CRC bits are interleaved with the information bits, before being sent to the input of inner Polar encoder. The interleaver is built to facilitate list decoding of the inner Polar code, where the Polar SCL decoder can take into account the dependency structure of the parity bits and the data bits from the outer code. In some applications, only some ($L_{c,i}$) CRC bits are used to account for the dependency structure of the parity bits to improve error correction capability of the code, while the other ($L_{d,i}$) CRC bits are treated like other information bits where the decoder would hypothesize their values during the decoding process. In this alternative embodiment, some of the distributed CRC bits are not treated the same as information bits. The error-correcting CRC bits are used in the process of tree expansion to select the better decoding paths in such a way that each surviving decoding path selected must be consistent with the dependency structure of the parity bits. The CRC check does not have to wait till the end of trellis expansion.

According to certain embodiments, instead of CRC bits, parity checksum (PC) bits can be generated in the precoder instead. It is generally recognized that any of the above methods and techniques described above as being applicable to CRC bits are equally applicable to PC bits.

Figure 10:
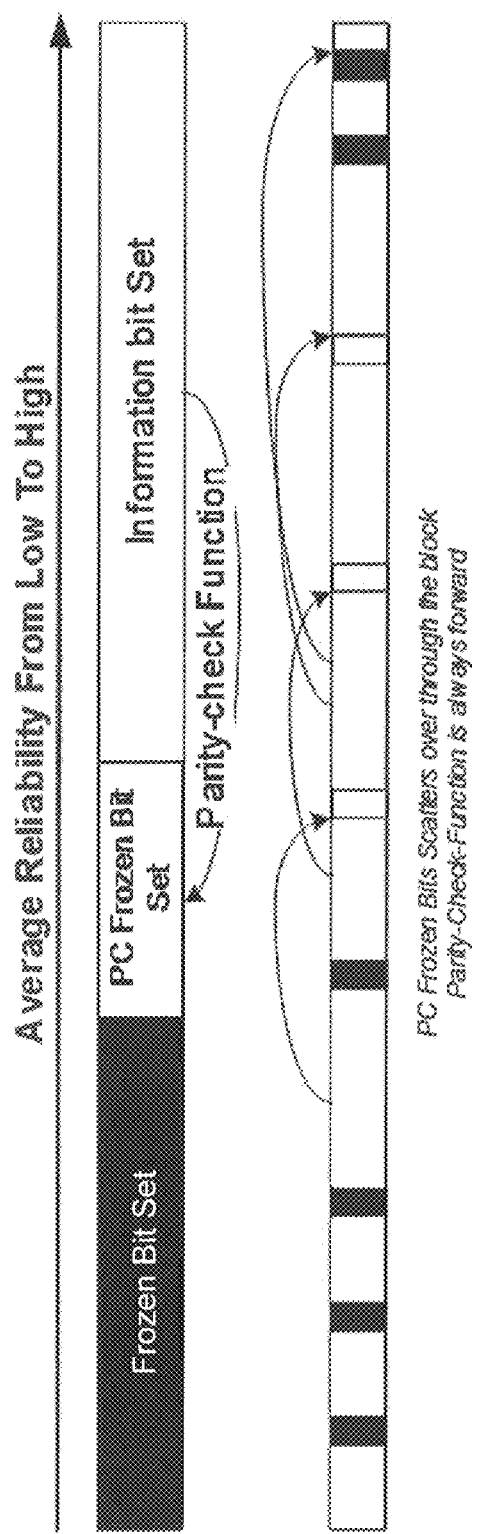
FIG. 10 illustrates an example parity-check Polar code, according to certain embodiments.

FIG. 10 illustrates a PC-Polar code, according to certain embodiments. Each of the PC bits, which may also be referred to as PC-frozen bits, is derived as the parity checksum of a selected subset of information bits. The PC bits are similar to the interleaved CRC bits, where each of the PC bits can be used individually to select the better decoding paths.

Similar to the adaptive allocation of CRC bits between error correction and error detection, the PC bits can be used for both functions, according to certain embodiments. The exact split of PC bits between these two functions can be done adaptively, as discussed below. Specifically, according to certain embodiments, the set of $L_{total}$ PC bits can be used in an adaptive manner to achieve the best combination of error detection performance and error correction performance. The adaptation is performed such that at least two of the following three options of allocating the PC bits for different purposes are supported, according to an embodiment:

OPTION A: Lower error detection capability, higher error correction capability. In this option, $L_{d,1}$ PC bits are used for error detection, $L_{c,1}$ PC bits are used to assist with SCL decoding (i.e., error correction).

OPTION B: Medium error detection capability, medium error correction capability. In this option, $L_{d,2}$ PC bits are used for error detection, $L_{c,2}$ PC bits are used to assist with SCL decoding (i.e., error correction).

OPTION C: Higher error detection capability, lower error correction capability. In this option, $L_{d,3}$ PC bits are used for error detection, $L_{c,3}$ PC bits are used to assist with SCL decoding (i.e., error correction).

In the above scenarios, $L_{total} = (L_{d,1} + L_{c,1}) = (L_{d,2} + L_{c,2}) = (L_{d,3} + L_{c,3})$, with: $0 <= L_{d,1} < L_{d,2} < L_{d,3}$, $L_{total} >= L_{c,1} > L_{c,2} > L_{c,3}$.

Similar to the CRC bits, the total number of PC bits, $L_{total}$, can be fixed for a size combination (K,M), or vary with the size combination. Here K is the number of information bits, and M the number of coded bits to send over the air.

In contrast to CRC bits, there is no non-zero minimum number of PC bits that have to be allocated to error detection purpose; that is, all PC bits can be used for error correction purpose.

According to certain embodiments, once an option from Option A-C is selected, the Polar decoder is run accordingly.

The $L_{c,i}$, i=1,2,3, PC bits are used in the middle of SCL decoding to select the best decoding path during path expansion.

The $L_{d,i}$, i=1,2,3, PC bits are not used in the middle of SCL decoding. Instead, the $L_{d,i}$ PC bits are treated as information bits during path expansion. Hard decisions for the $L_{d,i}$ PC bits are made. Then the $L_{d,i}$ PC bits are used as checksum at the end of SCL decoding to detect if the SCL output is a valid codeword or not.

Similar to CRC-assisted Polar, the adaption can be performed as a function of various configuration parameters such as data service type, latency requirement, block error rate target, and UE category. Additionally, both the value $L_{total}$, and the split of $L_{total}$ between $L_{c,i}$ and $L_{d,i}$, can be adapted.

Figure 11:
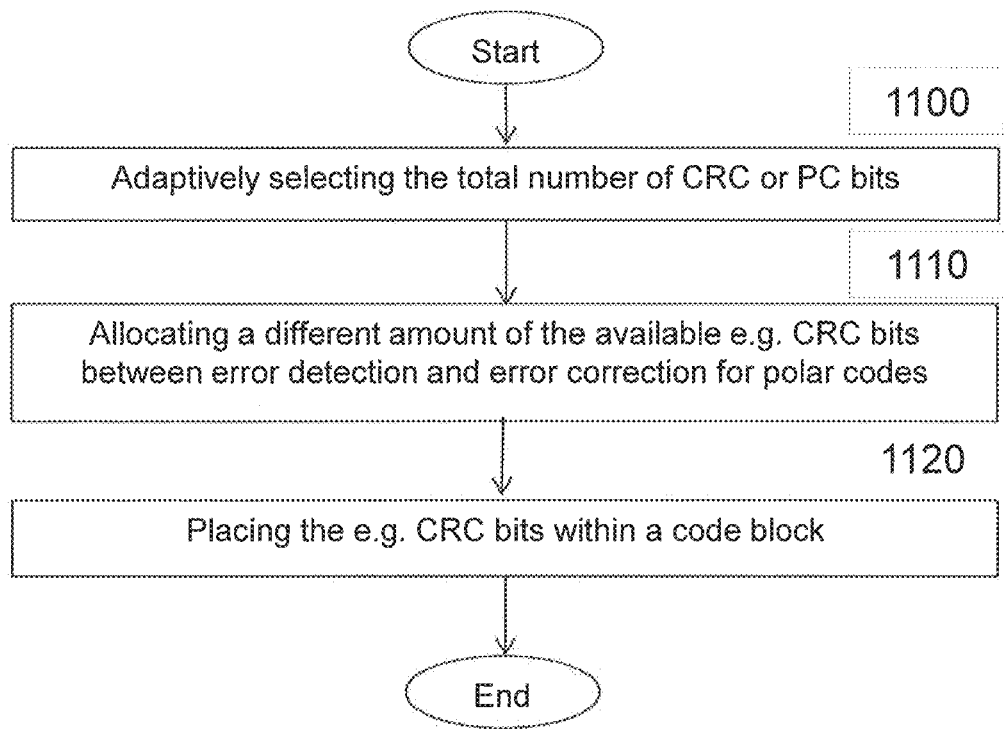
FIG. 11 illustrates an example method for adaptively selecting a total number of CRC or PC bits, according to certain embodiments, according to certain embodiments.

FIG. 11 is a flow diagram illustrating an example method for adaptively selecting a total number of CRC or PC bits, according to certain embodiments. As shown in FIG. 11, at step 1100, a network node adaptively selects the total number of, for example, CRC bits. At step 1110, a different amount of the available CRC bits can be allocated between error detection and error correction for Polar codes. At step 1120, the CRC bits can be placed within a code block. As described above, the precoder bits can be CRC bits or parity-checksum (PC) bits, according to various embodiments.

Figure 12:
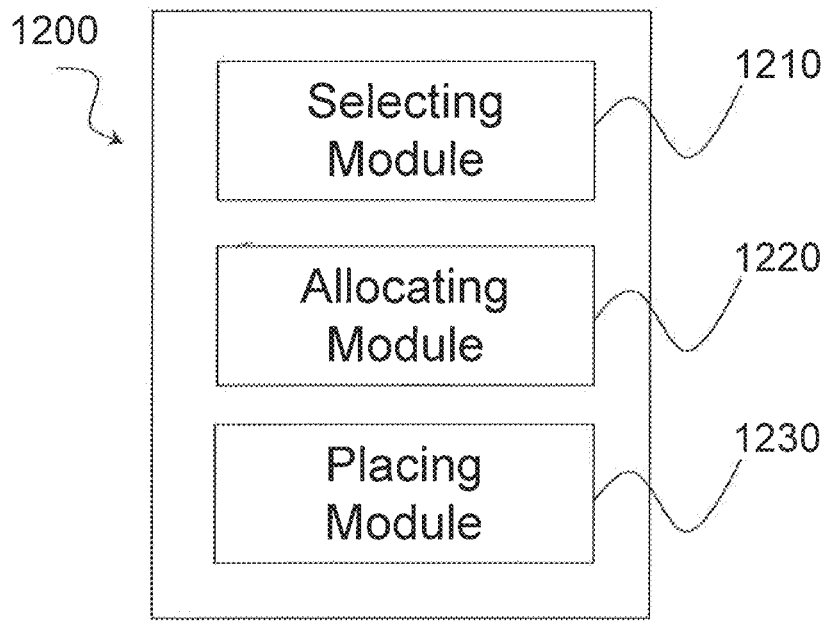
FIG. 12 illustrates a virtual computing device, according to certain embodiments.

In certain embodiments, the method for adaptively selecting a total number of CRC or PC bits as described above may be performed by a computer networking virtual apparatus. FIG. 12 illustrates an example virtual computing device 1200 for adaptively selecting a total number of CRC or PC bits, according to certain embodiments. In certain embodiments, virtual computing device 1200 may include modules for performing steps similar to those described above with regard to the method illustrated and described in FIG. 11. For example, virtual computing device 1200 may include a selecting module 1210, an allocating module 1220, a placing module 1230, and any other suitable modules for adaptively selecting a total number of CRC or PC bits. In some embodiments, one or more of the modules may be implemented using one or more processor(s) 28 of FIG. 3 or one or more processor(s) 58 of FIG. 6. In certain embodiments, the functions of two or more of the various modules may be combined into a single module.

The selecting module 1210 may perform the selecting functions of virtual computing device 1200. For example, in a particular embodiment, selecting module 1210 may adaptively select the total number of CRC or PC bits.

The allocating module 1220 may perform the allocation functions of virtual computing device 1200. For example, in a particular embodiment, allocating module 1220 may allocate a different amount of the available CRC bits, for example, between error detection and error correction for Polar codes.

The placing module 1230 may perform the placing functions of virtual computing device 1200. For example, in a particular embodiment, placing module 1230 may place the CRC bits, for example, within a code block.

Other embodiments of virtual computing device 1200 may include additional components beyond those shown in FIG. 12 that may be responsible for providing certain aspects of the functionality, including any of the functionality described above and/or any additional functionality (including any functionality necessary to support the solutions described above). The various different types of devices and radio nodes may include components having the same physical hardware but configured (e.g., via programming) to support different radio access technologies, or may represent partly or entirely different physical components.

Figure 13:
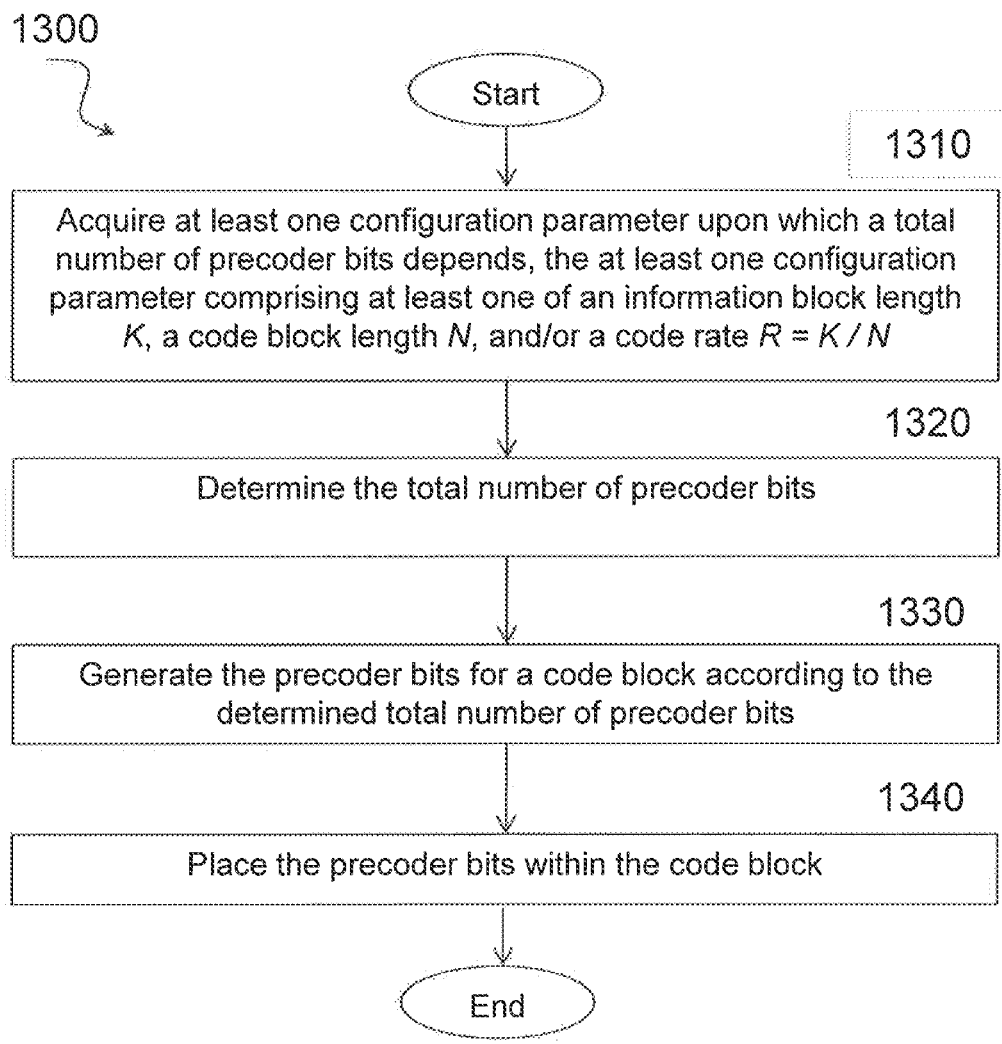
FIG. 13 illustrates an example method by a transmitter for adaptively generating precoder bits for a Polar code, according to certain embodiments.

FIG. 13 illustrates an example method 1300 by a transmitter for adaptively generating precoder bits for a Polar code, according to certain embodiments. According to certain embodiments, the transmitter may be a wireless device such as wireless device 56, described above. According to certain other embodiments, the transmitter may be a network node such as radio access node 24 or another network node. In various embodiments, the precoder bits may include CRC bits or PC bits.

The method begins at step 1310 when the transmitter acquires at least one configuration parameter upon which a total number of precoder bits depends. The at least one configuration parameter may include at least one of an information block length K, a code block length N, and/or a code rate R=K/N.

At step 1320, the transmitter determines the total number of precoder bits. In a particular embodiment, for example, the transmitter may allocate a first number of the available precoder bits ($L_d$) to error detection and a second number of the available precoder bits ($L_c$) to error correction. According to a particular embodiment, the first number of the available precoder bits ($L_d$) may be a minimum number of precoder bits ($L_{d,0}$) associated with a minimum level of error detection for a number of info bits and the second number of the available precoder bits ($L_c$) may be determined by subtracting the first number of available precoder bits ($L_d$) from a total number of available precoder bits ($L_{total}$). In another particular embodiment, the first number of the available precoder bits ($L_d$) allocated to error detection may be greater than a minimum number of precoder bits ($L_{d,0}$) associated with a minimum level of error detection to provide increased error detection capability.

In still another particular embodiment, the transmitter may determine the total number of precoder bits by performing one of:

- allocating a first number of the available precoder bits ($L_{d,1}$) to error detection and a second number of the available precoder bits ($L_{c,1}$) to error correction for lower error detection capability and higher error correction capability;
- allocating a third number of the available precoder bits ($L_{d,2}$) to error detection and a fourth number of the available precoder bits ($L_{c,2}$) to error correction for medium error detection capability and medium error correction capability;
- allocating a fifth number of the available precoder bits ($L_{d,3}$) to error detection and a sixth number of the available precoder bits ($L_{c,3}$) to error correction for higher error detection capability and lower error correction capability, and In any of the above scenarios, for a minimum number of precoder bits ($L_{d,0}$) associated with a minimum level of error detection to provide increased error detection capability, the following may be true:

$$L_{d,0} <= L_{d,1} < L_{d,2} < L_{d,3}, \text{ and}$$

$$L_{c,1} > L_{c,2} > L_{c,3}$$

At step 1330, the transmitter generates the precoder bits for a code block according to the determined total number of precoder bits. According to various particular embodiments, the precoder bits may be generated based on at least one of latency requirements, reliability requirements, wireless channel conditions as indicated by a target code rate, and available radio resources as indicated by a code length. Where the precoder bits are CRC bits, for example, the CRC bits may be generated using a single CRC generated polynomial, in a particular embodiment. In another particular embodiment, the CRC bits may be generated using two or more CRC generated polynomials.

At step 1340, the transmitter places the precoder bits within the code block. In a particular embodiment the transmitter may place the precoder bits in the code block as a contiguous block. In another embodiment, the transmitter may use an interleaver to place the precoder bits at interleaved positions within the code block.

Figure 14:
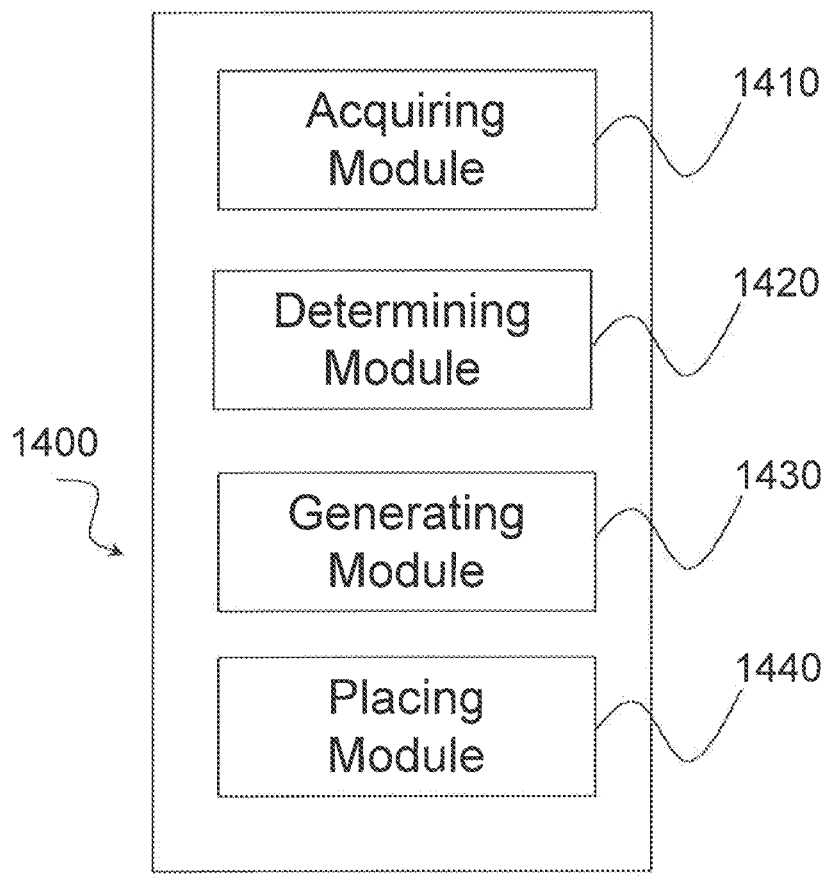
FIG. 14 illustrates another virtual computing device, according to certain embodiments.

In certain embodiments, the method for adaptively generating precoder bits for a Polar code as described above may be performed by a virtual computing device. FIG. 14 illustrates an example virtual computing device 1400 for adaptively generating precoder bits for a Polar code, according to certain embodiments. In certain embodiments, virtual computing device 1400 may include modules for performing steps similar to those described above with regard to the method 1300 illustrated and described in FIG. 13. For example, virtual computing device 1400 may include at least one acquiring module 1410, a determining module 1420, a generating module 1430, a placing module 1440, and any other suitable modules for adaptively generating precoder bits for a Polar code. In some embodiments, one or more of the modules may be implemented using one or more processors 28 of FIG. 3 or one or more processors 58 of FIG. 6. In certain embodiments, the functions of two or more of the various modules may be combined into a single module.

The acquiring module 1410 may perform the acquiring functions of virtual computing device 1400. For example, in a particular embodiment, acquiring module 1410 may acquire at least one configuration parameter upon which a total number of precoder bits depends.

The determining module 1420 may perform the determining functions of virtual computing device 1400. For example, in a particular embodiment, determining module 1420 may determine the total number of precoder bits.

The generating module 1430 may perform the generating functions of virtual computing device 1400. For example, in a particular embodiment, generating module 1430 may generate the precoder bits for a code block according to the determined total number of precoder bits.

The placing module 1440 may perform the placing functions of virtual computing device 1400. For example, in a particular embodiment, placing module 1440 may place the precoder bits within the code block.

Other embodiments of virtual computing device 1400 may include additional components beyond those shown in FIG. 14 that may be responsible for providing certain aspects of the transmitter's functionality, including any of the functionality described above and/or any additional functionality (including any functionality necessary to support the solutions described above). The various different types of transmitters may include components having the same physical hardware but configured (e.g., via programming) to support different radio access technologies, or may represent partly or entirely different physical components.

Figure 15:
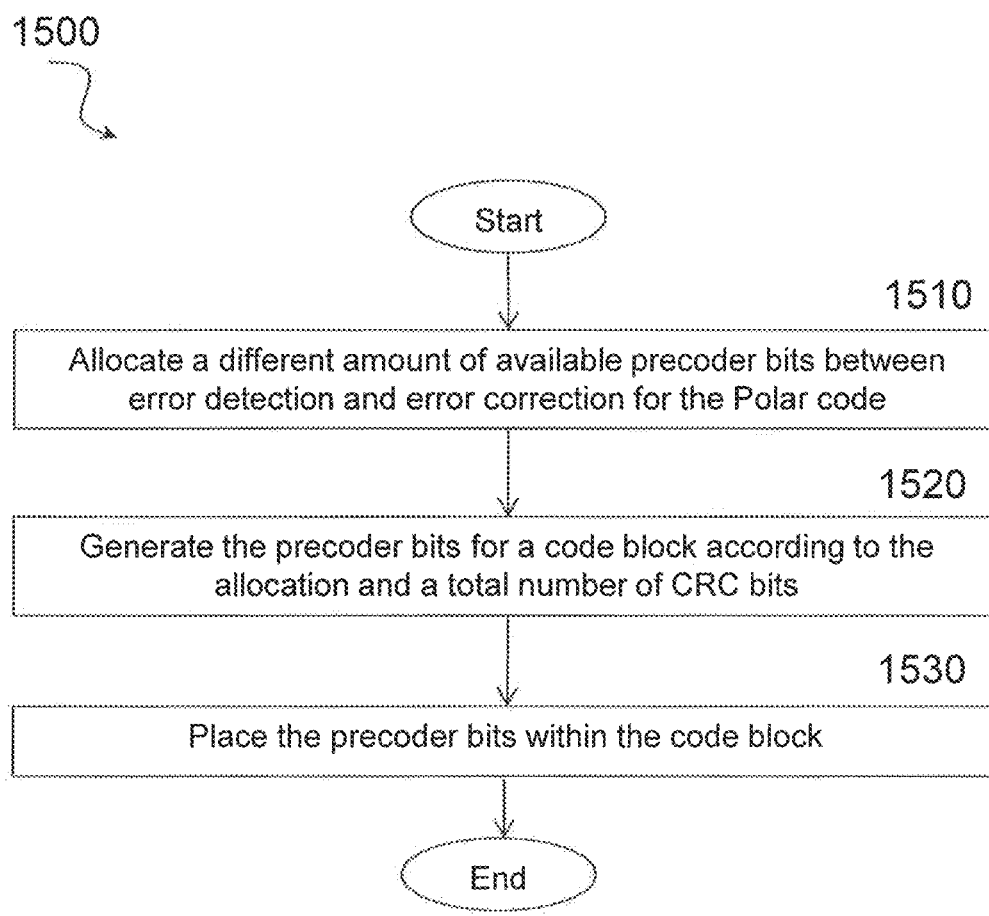
FIG. 15 illustrates another example method by a transmitter for adaptively generating precoder bits for a Polar code, according to certain embodiments.

FIG. 15 illustrates another example method 1500 by a transmitter for adaptively generating precoder bits for a Polar code, according to certain embodiments. According to certain embodiments, the transmitter may be a wireless device such as wireless device 56, described above. According to certain other embodiments, the transmitter may be a network node such as radio access node 24 or another network node. In various embodiments, the precoder bits may include CRC bits or PC bits.

The method begins at step 1510 when the transmitter allocates a different amount of available precoder bits between error detection and error correction for the Polar code. According to various particular embodiments, the precoder bits may be allocated based on at least one of latency requirements, reliability requirements, wireless channel conditions as indicated by a target code rate, and available radio resources as indicated by a code length.

In a particular embodiment, the transmitter may allocate a first number of the available precoder bits ($L_d$) to error detection and a second number of the available precoder bits ($L_c$) to error correction. 24. For example, the first number of the available precoder bits ($L_d$) may be a minimum number of precoder bits ($L_{d,0}$) associated with a minimum level of error detection for a number of info bits and the second number of the available precoder bits ($L_c$) is determined by subtracting the first number of available precoder bits ($L_d$) from a total number of available precoder bits ($L_{total}$), in a particular embodiment. In another embodiment, the first number of the available precoder bits ($L_d$) allocated to error detection may be greater than a minimum number of precoder bits ($L_{d,0}$) associated with a minimum level of error detection to provide increased error detection capability.

In still another particular embodiment, the transmitter may determine the total number of precoder bits by performing one of:

allocating a first number of the available precoder bits ($L_{d,1}$) to error detection and a second number of the available precoder bits ($L_{c,1}$) to error correction for lower error detection capability and higher error correction capability;

allocating a third number of the available precoder bits ($L_{d,2}$) to error detection and a fourth number of the available precoder bits ($L_{c,2}$) to error correction for medium error detection capability and medium error correction capability;

allocating a fifth number of the available precoder bits ($L_{d,3}$) to error detection and a sixth number of the available precoder bits ($L_{c,3}$) to error correction for higher error detection capability and lower error correction capability, and In any of the above scenarios, for a minimum number of precoder bits ($L_{d,0}$) associated with a minimum level of error detection to provide increased error detection capability, the following may be true:

$L_{d,0} <= L_{d,1} < L_{d,2} < L_{d,3}$, and $L_{c,1} > L_{c,2} > L_{c,3}$.

At step 1520, the transmitter generates the precoder bits for a code block according to the allocation and a total number of CRC bits. In a particular embodiment, for example, the CRC bits may be generated using a single CRC generated polynomial. In another particular embodiment, the CRC bits may be generated using two or more CRC generated polynomials.

At step 1530, the transmitter places the precoder bits within the code block. In a particular embodiment the transmitter may place the precoder bits in the code block as a contiguous block. In another embodiment, the transmitter may use an interleaver to place the precoder bits at interleaved positions within the code block.

Figure 16:
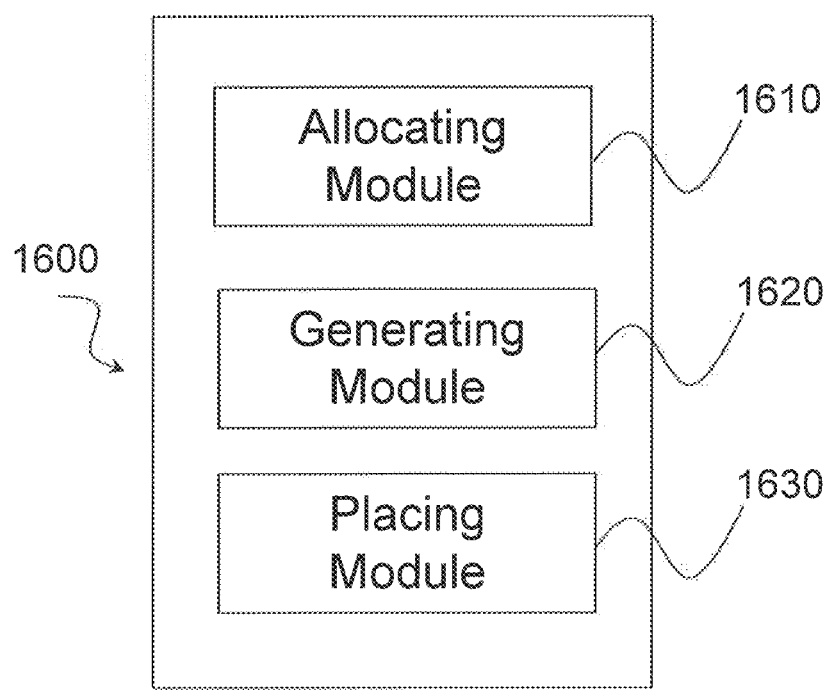
FIG. 16 illustrates another virtual computing device, according to certain embodiments.

In certain embodiments, the method for adaptively generating precoder bits for a Polar code as described above may be performed by a virtual computing device. FIG. 16 illustrates an example virtual computing device 1600 for adaptively generating precoder bits for a Polar code, according to certain embodiments. In certain embodiments, virtual computing device 1600 may include modules for performing steps similar to those described above with regard to the method 1500 illustrated and described in FIG. 15. For example, virtual computing device 1600 may include at least one allocating module 1610, a generating module 1620, a placing module 1630, and any other suitable modules for adaptively generating precoder bits for a Polar code. In some embodiments, one or more of the modules may be implemented using one or more processors 28 of FIG. 3 or one or more processors 58 of FIG. 6. In certain embodiments, the functions of two or more of the various modules may be combined into a single module.

The allocating module 1610 may perform the allocating functions of virtual computing device 1600. For example, in a particular embodiment, allocating module 1610 may allocate a different amount of available precoder bits between error detection and error correction for the Polar code.

The generating module 1620 may perform the generating functions of virtual computing device 1600. For example, in a particular embodiment, generating module 1620 may generate the precoder bits for a code block according to the allocation and a total number of CRC bits.

The placing module 1630 may perform the placing functions of virtual computing device 1600. For example, in a particular embodiment, placing module 1630 may place the precoder bits within the code block.

Other embodiments of virtual computing device 1600 may include additional components beyond those shown in FIG. 16 that may be responsible for providing certain aspects of the transmitter's functionality, including any of the functionality described above and/or any additional functionality (including any functionality necessary to support the solutions described above). The various different types of transmitters may include components having the same physical hardware but configured (e.g., via programming) to support different radio access technologies, or may represent partly or entirely different physical components.

Figure 17:
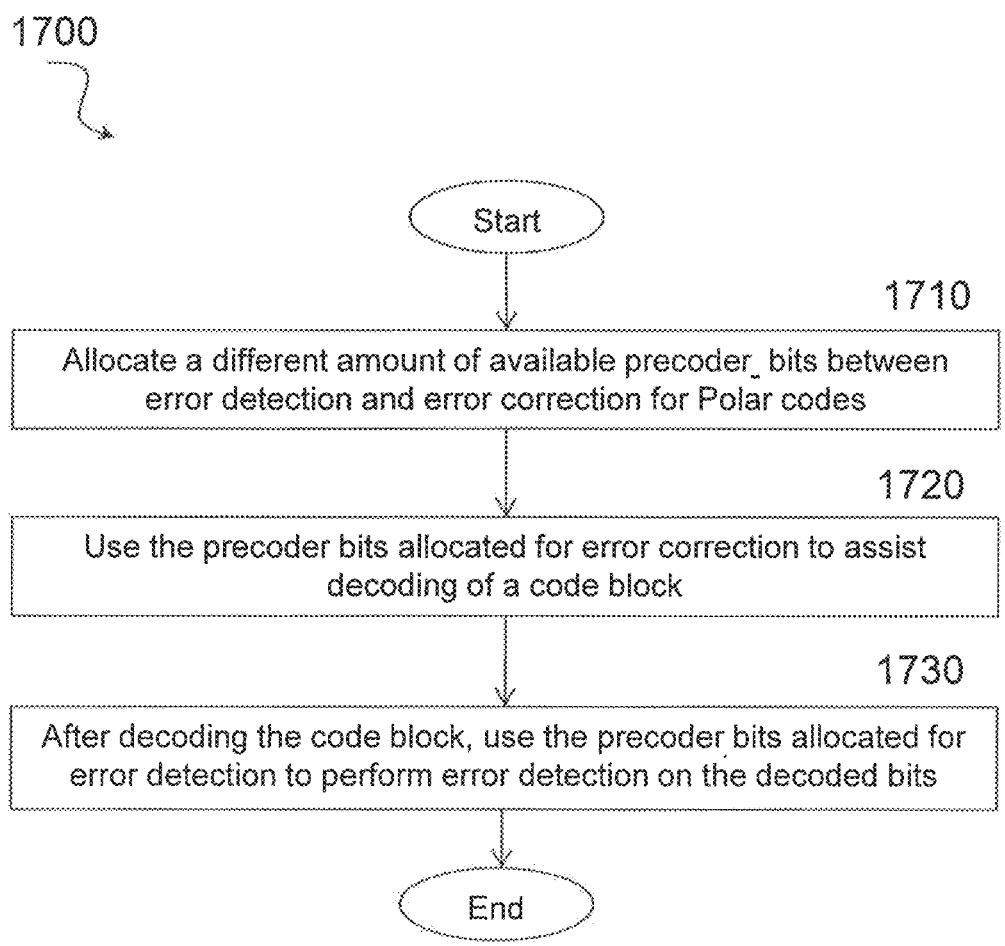
FIG. 17 illustrates an example method by a receiver for adaptively using precoder bits to assist in decoding of a Polar code, according to certain embodiments.

FIG. 17 illustrates an example method 1700 by a receiver for adaptively using precoder bits to assist decoding of a Polar code, according to certain embodiments. According to certain embodiments, the receiver may be a wireless device such as wireless device 56, described above. According to certain other embodiments, the receiver may be a network node such as radio access node 24 or another network node. In various embodiments, the precoder bits may include CRC bits or PC bits.

The method begins at step 1710 when the receiver allocates a different amount of available precoder bits between error detection and error correction for a Polar code. According to various particular embodiments, the precoder bits may be allocated based on at least one of latency requirements, reliability requirements, wireless channel conditions as indicated by a target code rate, and available radio resources as indicated by a code length.

In a particular embodiment, the receiver may allocate a first number of the available precoder bits ($L_d$) to error detection and a second number of the available precoder bits ($L_c$) to error correction. 24. For example, the first number of the available precoder bits ($L_d$) may be a minimum number of precoder bits ($L_{d,0}$) associated with a minimum level of error detection for a number of info bits and the second number of the available precoder bits ($L_c$) may be determined by subtracting the first number of available precoder bits ($L_d$) from a total number of available precoder bits ($L_{total}$), in a particular embodiment. In another embodiment, the first number of the available precoder bits ($L_d$) allocated to error detection may be greater than a minimum number of precoder bits ($L_{d,0}$) associated with a minimum level of error detection to provide increased error detection capability.

According to certain other embodiments, when allocating the precoder bits, the receiver may perform one of the following steps:

allocating a first number of the available precoder bits ($L_{d,1}$) to error detection and a second number of the available precoder bits ($L_{c,1}$) to error correction for lower error detection capability and higher error correction capability;

allocating a third number of the available precoder bits ($L_{d,2}$) to error detection and a fourth number of the available precoder bits ($L_{c,2}$) to error correction for medium error detection capability and medium error correction capability; or allocating a fifth number of the available precoder bits ($L_{d,3}$) to error detection and a sixth number of the available precoder bits ($L_{c,3}$) to error correction for higher error detection capability and lower error correction capability;

In the above scenarios, the minimum number of precoder bits ($L_{d,0}$) may be associated with a minimum level of error detection to provide increased error detection capability, and the following may be true:

$$L_{d,0} <= L_{d,1} < L_{d,2} < L_{d,3}, \text{ and}$$

$$L_{c,1} > L_{c,2} > L_{c,3}$$

At step 1720, the receiver uses the precoder bits allocated for error correction to assist decoding of a code block. After decoding the code block, the receiver uses the precoder bits allocated for error detection to perform error detection on the decoded bits, at step 1730.

According to certain embodiments, the method may further include the receiver receiving, from a transmitter, an indication of the different amount of available precoder bits for allocation between error detection and error correction for the Polar codes. The receiver may perform the allocation step 1710 based on the indication.

Figure 18:
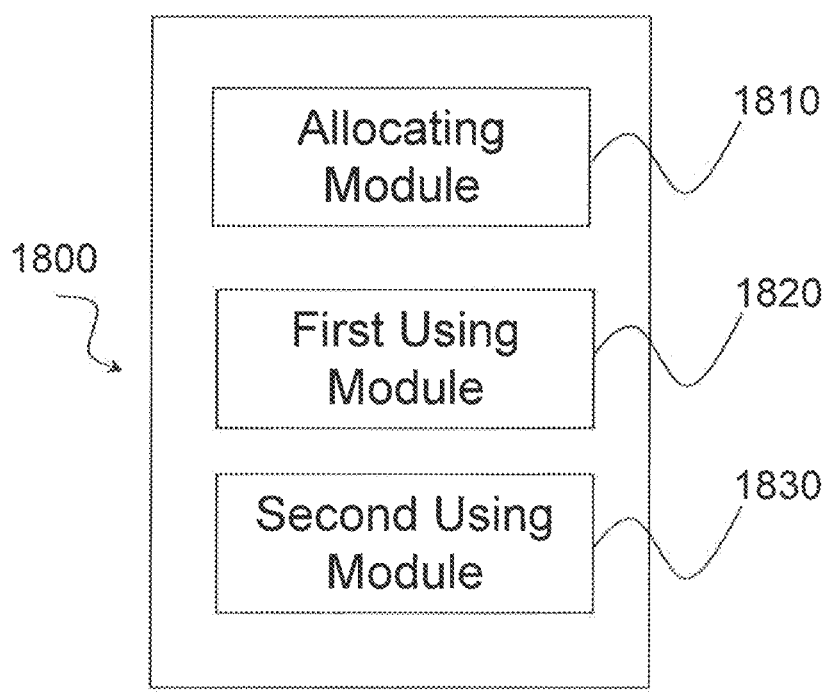
FIG. 18 illustrates another virtual computing device, according to certain embodiments.

In certain embodiments, the method for adaptively using precoder bits to assist decoding of a Polar code as described above may be performed by a virtual computing device. FIG. 18 illustrates an example virtual computing device 1800 for adaptively using precoder bits to assist decoding of a Polar code, according to certain embodiments. In certain embodiments, virtual computing device 1800 may include modules for performing steps similar to those described above with regard to the method 1700 illustrated and described in FIG. 17. For example, virtual computing device 1800 may include at least one allocating module 1810, a first using module 1820, a second using module 1830, and any other suitable modules for adaptively using precoder bits to assist decoding of a Polar code. In some embodiments, one or more of the modules may be implemented using one or more processors 28 of FIG. 3 or one or more processors 58 of FIG. 6. In certain embodiments, the functions of two or more of the various modules may be combined into a single module.

The allocating module 1810 may perform the allocating functions of virtual computing device 1800. For example, in a particular embodiment, allocating module 1810 may allocate a different amount of available precoder bits between error detection and error correction for a Polar code.

The first using module 1820 may perform certain of the using functions of virtual computing device 1800. For example, in a particular embodiment, first using module 1820 may use the precoder bits allocated for error correction to assist decoding of a code block.

The second using module 1830 may perform certain other of the using functions of virtual computing device 1800. For example, in a particular embodiment, second using module 1830 may use the precoder bits allocated for error detection to perform error detection on the decoded bits.

Other embodiments of virtual computing device 1800 may include additional components beyond those shown in FIG. 18 that may be responsible for providing certain aspects of the receiver's functionality, including any of the functionality described above and/or any additional functionality (including any functionality necessary to support the solutions described above). The various different types of receivers may include components having the same physical hardware but configured (e.g., via programming) to support different radio access technologies, or may represent partly or entirely different physical components.

As disclosed herein, methods, systems and apparatus are disclosed for adaptively selecting the total number of CRC or PC bits, allocating a different amount of the available CRC bits between error detection and error correction for Polar codes, and placing the CRC bits within a code block. As a result, various balances of error correction and error detection capabilities can be achieved in the SCL decoder. The features described allow the concatenation of CRC and PC code to be customized for different amounts of payloads, different coding parameters needed for the varying communication channel conditions, and different types of applications with different requirements in terms of, for example, latency and reliability. Stated differently, according to various embodiments, the foregoing features may be based on the requirements (e.g. latency or reliability) of the underlying application, the wireless channel conditions as indicated by the target code rate, and/or the available radio resources as indicated by the code length.

In one embodiment, the precoder bits can be CRC bits. According to an alternative embodiment, the precoder bits are parity-checksum (PC) bits.

According to various embodiments, an advantage of features herein is to allow the concatenation of CRC code to be customized for different amounts of payloads, different coding parameters needed for the varying communication channel conditions, and different types of applications with different requirements in terms of, for example, latency and reliability. Since wireless communications need to cover a wide range of circumstances and applications, embodiments of this disclosure allow the system to judiciously allocate radio resources based on cost-benefit tradeoffs.

While processes in the figures may show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

The invention claimed is:

1. A method by a transmitter comprising a polar encoder for adaptively generating precoder bits for a Polar code, the method comprising:
   acquiring an information block length K, and a code block length, N, associated with information bits to be transmitted in an uplink control information message;
   determining a number of CRC bits, the number of CRC bits depending upon the information block length, K, and the code block length, N;
   generating the CRC bits according to the determined number of CRC bits;
   attaching the CRC bits to the information bits; and
   encoding, by the polar encoder, the information bits and the CRC bits with a Polar code.

2. The method of claim 1, wherein the CRC bits are attached as a precoder of the Polar code.

3. The method of claim 1, wherein attaching the CRC bits comprises placing the CRC bits at interleaved positions through the use of an interleaver.

4. The method of claim 1, wherein the step of generating the CRC bits is based on at least one of:
   latency requirements;
   reliability requirements;
   wireless channel conditions as indicated by a target code rate; and
   available radio resources as indicated by the code block length, N.

5. The method of claim 1, wherein generating the CRC bits comprises generating CRC bits using a single CRC generator polynomial.

6. The method of claim 1, wherein generating the CRC bits comprises generating CRC bits using two or more CRC generator polynomials.

7. The method of claim 1, wherein determining the number of CRC bits comprises:
   allocating a first number of the available CRC bits ($L_d$) to error detection; and
   allocating a second number of the available CRC bits ($L_c$) to error correction.

8. The method of claim 7, wherein:
   the first number of the available CRC bits ($L_d$) is a minimum number of CRC bits ($L_{d,0}$) associated with a minimum level of error detection for a number of info bits; and
   the second number of the available CRC bits ($L_c$) is determined by subtracting the first number of available CRC bits ($L_d$) from a number of available CRC bits ($L_{total}$).

9. The method of claim 7, wherein:
   the first number of the available CRC bits ($L_d$) allocated to error detection is greater than a minimum number of CRC bits ($L_{d,0}$) associated with a minimum level of error detection to provide increased error detection capability.

10. The method of claim 1, wherein determining the number of CRC bits comprises:
    (a) allocating a first number of the available CRC bits ($L_{d,1}$) to error detection and a second number of the available CRC bits ($L_{c,1}$) to error correction for lower error detection capability and higher error correction capability;
    (b) allocating a third number of the available CRC bits ($L_{d,2}$) to error detection and a fourth number of the available CRC bits ($L_{c,2}$) to error correction for medium error detection capability and medium error correction capability;
    (c) allocating a fifth number of the available CRC bits ($L_{d,3}$) to error detection and a sixth number of the available CRC bits ($L_{c,3}$) to error correction for higher error detection capability and lower error correction capability, and wherein for a minimum number of CRC bits ($L_{d,0}$) associated with a minimum level of error detection to provide increased error detection capability, the following is true:

$$L_{d,0} <= L_{d,1} < L_{d,2} < L_{d,3}, \text{ and } L_{c,1} > L_{c,2} > L_{c,3}.$$

11. The method of claim 1, wherein the transmitter comprises a wireless device.

12. The method of claim 1, wherein the transmitter comprises a network node.

13. A transmitter comprising a polar encoder for adaptively generating precoder bits for a Polar code, the transmitter comprising:
    at least one processor configured to:
    acquire an information block length K, and a code block length, N, associated with information bits to be transmitted in an uplink control information message;
    determine a number of CRC bits, the number of CRC bits depending upon the information block length, K, and the code block length, N;
    generate the CRC bits according to the determined number of CRC bits;
    attach the CRC bits to the information bits; and
    encode, by the polar encoder, the information bits and the CRC bits with a Polar code.

14. The method of claim 13, wherein the CRC bits are attached as a precoder of the Polar code.

15. The transmitter of claim 13, wherein when attaching the CRC bits the at least one processor is configured to place the CRC bits at interleaved positions through the use of an interleaver.

16. The transmitter of claim 13, wherein the CRC bits are generated based on at least one of:
    latency requirements;
    reliability requirements;
    wireless channel conditions as indicated by a target code rate; and
    available radio resources as indicated by a code length.

17. The transmitter of claim 13, wherein the at least one processor is configured to generate the CRC bits using a single CRC generator polynomial.

18. The transmitter of claim 13, wherein the at least one processor is configured to generate the CRC bits using two or more CRC generator polynomials.

19. The transmitter of claim 13, wherein when determining the number of CRC bits the at least one processor is configured to:
    allocate a first number of the available CRC bits ($L_d$) to error detection; and
    allocate a second number of the available CRC bits ($L_c$) to error correction.

20. The transmitter of claim 19, wherein:
    the first number of the available CRC bits ($L_d$) is a minimum number of CRC bits ($L_{d,0}$) associated with a minimum level of error detection for a number of info bits; and
    the second number of the available CRC bits ($L_c$) is determined by subtracting the first number of available CRC bits ($L_d$) from a number of available CRC bits ($L_{total}$).

21. The transmitter of claim 19, wherein:

the first number of the available CRC bits ($L_d$) allocated to error detection is greater than a minimum number of CRC bits ($L_{d,0}$) associated with a minimum level of error detection to provide increased error detection capability.

22. The transmitter of claim 13, wherein when determining the number of CRC bits the at least one processor is configured to:

(a) allocate a first number of the available CRC bits ($L_{d,1}$) to error detection and a second number of the available CRC bits ($L_{c,1}$) to error correction for lower error detection capability and higher error correction capability;

(b) allocate a third number of the available CRC bits ($L_{d,2}$) to error detection and a fourth number of the available CRC bits ($L_{c,2}$) to error correction for medium error detection capability and medium error correction capability;

(c) allocate a fifth number of the available CRC bits ($L_{d,3}$) to error detection and a sixth number of the available CRC bits ($L_{c,3}$) to error correction for higher error detection capability and lower error correction capability, and wherein for a minimum number of CRC bits ($L_{d,0}$) associated with a minimum level of error detection to provide increased error detection capability, the following is true:

$$L_{d,0} \leq L_{d,1} < L_{d,2} < L_{d,3}, \text{ and } L_{c,1} > L_{c,2} > L_{c,3}.$$

23. The transmitter of claim 13, wherein the transmitter comprises a wireless device.

24. The transmitter of claim 13, wherein the transmitter comprises a network node.

* * * * *

UNITED STATES PATENT AND TRADEMARK OFFICE
CERTIFICATE OF CORRECTION

PATENT NO. : 12,212,340 B2  
APPLICATION NO. : 18/485381  
DATED : January 28, 2025  
INVENTOR(S) : Blankenship et al.

Page 1 of 1

It is certified that error appears in the above-identified patent and that said Letters Patent is hereby corrected as shown below:

In the Specification

In Column 1, Line 8, delete "2021" and insert -- 2021, now U.S. Pat. No. 11,824,561, --, therefor.

In Column 1, Line 10, delete "2019" and insert -- 2019, now U.S. Pat. No. 11, 165,445, --, therefor.

In Column 1, Lines 10-11, delete "U.S.C. 371" and insert -- U.S.C. § 371 --, therefor.

In Column 7, Line 67, delete "FIG. 7" and insert -- FIG. 4 --, therefor.

In Column 8, Line 64, delete "$L_{total}=+L_{c,0})$" and insert -- $L_{total}=(L_{d,0}+L_{c,0})$ --, therefor.

In Column 18, Line 54, delete "Since wireless" and insert -- Since 5G wireless --, therefor.

In the Claims

In Column 20, Line 33, in Claim 14, delete "The method of claim" and insert -- The transmitter of claim --, therefor.

Signed and Sealed this  
Twelfth Day of August, 2025

Coke Morgan Stewart  
*Acting Director of the United States Patent and Trademark Office*